United States Patent
Lee et al.

(10) Patent No.: US 8,779,828 B2
(45) Date of Patent: Jul. 15, 2014

(54) SEMICONDUCTOR DEVICE

(75) Inventors: Heon-hee Lee, Hwaseong-si (KR);
Hoi-jin Lee, Seoul (KR); Taek-kyun Shin, Gwangmyeong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 57 days.

(21) Appl. No.: 13/417,531

(22) Filed: Mar. 12, 2012

(65) Prior Publication Data

US 2012/0249211 A1 Oct. 4, 2012

(30) Foreign Application Priority Data

Mar. 30, 2011 (KR) .......... 10-2011-0029030

(51) Int. Cl.
*H03L 5/00* (2006.01)

(52) U.S. Cl.
USPC .............................. 327/333; 327/80

(58) Field of Classification Search
USPC .............. 327/108, 333; 326/63, 68, 80, 81; 365/189.11
See application file for complete search history.

(56) References Cited

U.S. PATENT DOCUMENTS

| | | | |
|---|---|---|---|
| 6,759,872 B2 * | 7/2004 | Lai et al. | 326/81 |
| 7,323,923 B2 | 1/2008 | Maeda et al. | |
| 7,675,798 B2 * | 3/2010 | Song | 365/205 |
| 2008/0054980 A1 | 3/2008 | Bajkowski et al. | |
| 2010/0244924 A1 | 9/2010 | Kiritani et al. | |

FOREIGN PATENT DOCUMENTS

| | | |
|---|---|---|
| JP | 2004-128590 A | 4/2004 |
| JP | 2009-010802 A | 1/2009 |

* cited by examiner

*Primary Examiner* — Long Nguyen
(74) *Attorney, Agent, or Firm* — Lee & Morse, P.C.

(57) ABSTRACT

A semiconductor device including a first function block operating at a first operation voltage having a first range and for generating a data signal, a second function block operating at a second operation voltage having a second range, and a voltage level control unit for performing or not performing a level shifting operation on a voltage level of the data signal depending on the existence or non-existence of a difference between the first operation voltage and the second operation voltage, and for transmitting a level-shifted data signal or the data signal to the second function block.

12 Claims, 15 Drawing Sheets

SEMICONDUCTOR DEVICE

Korean Patent Application No. 10-2011-0029030, filed on Mar. 30, 2011, in the Korean Intellectual Property Office, and entitled, "Semiconductor Device," is incorporated by reference herein in its entirety.

BACKGROUND

1. Field

The inventive concept relates to semiconductor devices, and more particularly, to semiconductor devices for applying a stable voltage to function blocks and for reducing and/or preventing a time delay.

2. Description of the Related Art

Function blocks operating at different voltages from each other may be included in a single semiconductor device. Here, a voltage level shifting operation is required to transmit and receive signals or data between the function blocks operating at the different voltages. In addition, a voltage that is applied to function blocks, which are designed to be operated with the same voltage, may vary.

SUMMARY

One or more embodiments provide a method of improving reliability of a semiconductor device by compensating for a varying voltage.

One or more embodiments provide a semiconductor device for stably applying a voltage to function blocks included in the semiconductor device and for preventing a time delay.

One or more embodiments provide a semiconductor device, including a first function block operating at a first operation voltage having a first range and generating a data signal, a second function block operating at a second operation voltage having a second range, and a voltage level control unit configured to selectively perform a level shifting operation on a voltage level of the data signal and to transmit a level-shifted data signal or the data signal to the second function block.

The voltage level control unit may be configured to selectively perform the level shifting operation when a difference between the first operation voltage and the second operation voltage is detected.

The first range and the second range may be different from each other.

The semiconductor device may include a first power line for applying the first operation voltage to the first function block, and a second power line for applying the second operation voltage to the second function block, the second power line being separated from the first power line.

The first function block may include a control logic, and the second function block may include a memory.

The first range and the second range may be the same.

The semiconductor device may include a first power line for applying the first operation voltage to the first function block and for applying the second operation voltage to the second function block.

The difference between the first operation voltage and the second operation voltage may correspond to a voltage drop or a voltage rise from the first operation voltage to the second operation voltage due to a time variance, or to a voltage drop or a voltage rise from the first operation voltage to the second operation voltage due to an operation of the first function block.

The voltage level control unit may be configured to shift the voltage level of the data signal generated in the first function block and to transmit the level-shifted data signal to the second function block, when the first operation voltage and the second operation voltage are different from each other, and the voltage level control unit may be configured to maintain the voltage level of the data signal generated in the first function block and to transmit the data signal to the second function block, when the first operation voltage and the second operation voltage are the same.

The voltage level control unit may include a level shifter configured to be activated by a level shifting signal when the first operation voltage and the second operation voltage are different from each other, to shift the voltage level of the data signal from the first operation voltage to the second operation voltage, and to transmit the level-shifted data signal to the second function block, and a buffer unit configured to be activated by a level shifting inversion signal having a logic level that is different from that of the level shifting signal, when the first operation voltage and the second operation voltage are the same, and to transmit the data signal to the second function block.

The voltage level control unit may include a level detecting unit configured to detect the difference between the first operation voltage and the second operation voltage and to generate the level shifting signal.

The semiconductor device may include a power controller configured to control an application of the first operation voltage to the first function block and an application of the second operation voltage to the second function block, wherein the power controller is configured to detect the difference between the first operation voltage and the second operation voltage, to generate the level shifting signal and the level shifting inversion signal, and to transmit the level shifting signal and the level shifting inversion signal to the voltage level control unit.

The buffer unit may include a tri-state buffer, the tri-state buffer being configured to be enabled in response to an inverted signal of the level shifting signal.

The semiconductor device may include a third function block configured to operate at a third operation voltage having a third range, wherein the voltage level control unit may be configured to selectively perform a level shifting operation on the data signal output from the first function block or the second function block, depending on a difference between the first operation voltage and the third operation voltage or a difference between the second operation voltage and the third operation voltage, and to transmit a level-shifted data signal or the data signal to the third function block.

The voltage level control unit may be configured to selectively perform the level shifting operation in response to a mode signal supplied thereto.

The voltage level control unit may be configured to maintain a voltage level of the data signal output from the first function block and transmit the data signal in response to a first type of the mode signal and is configured to shift the voltage level of the data signal to a second voltage level and transmit the level-shifted data signal in response to a second type of the mode signal.

The first type of mode signal may be a high speed mode signal, and the second type of mode signal may be a low speed mode signal.

The mode signal may represent a high speed mode or a low speed mode of the semiconductor device.

One or more embodiments provide a semiconductor device, including a first function block operating at a first operation voltage having a first range and generating a data signal, a second function block operating at a second operation voltage having a second range, and a voltage level control unit configured to perform a level shifting operation on a voltage level of the data signal and to transmit a level-shifted data signal in response to a detected difference between the first operation voltage and the second operation voltage or in response to a low speed mode signal and to otherwise transmit the data signal to the second function block.

The voltage level control unit may be configured to maintain the voltage level of the data signal when no difference is detected between the first operation voltage and the second operation voltage or in response to a high speed mode signal.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
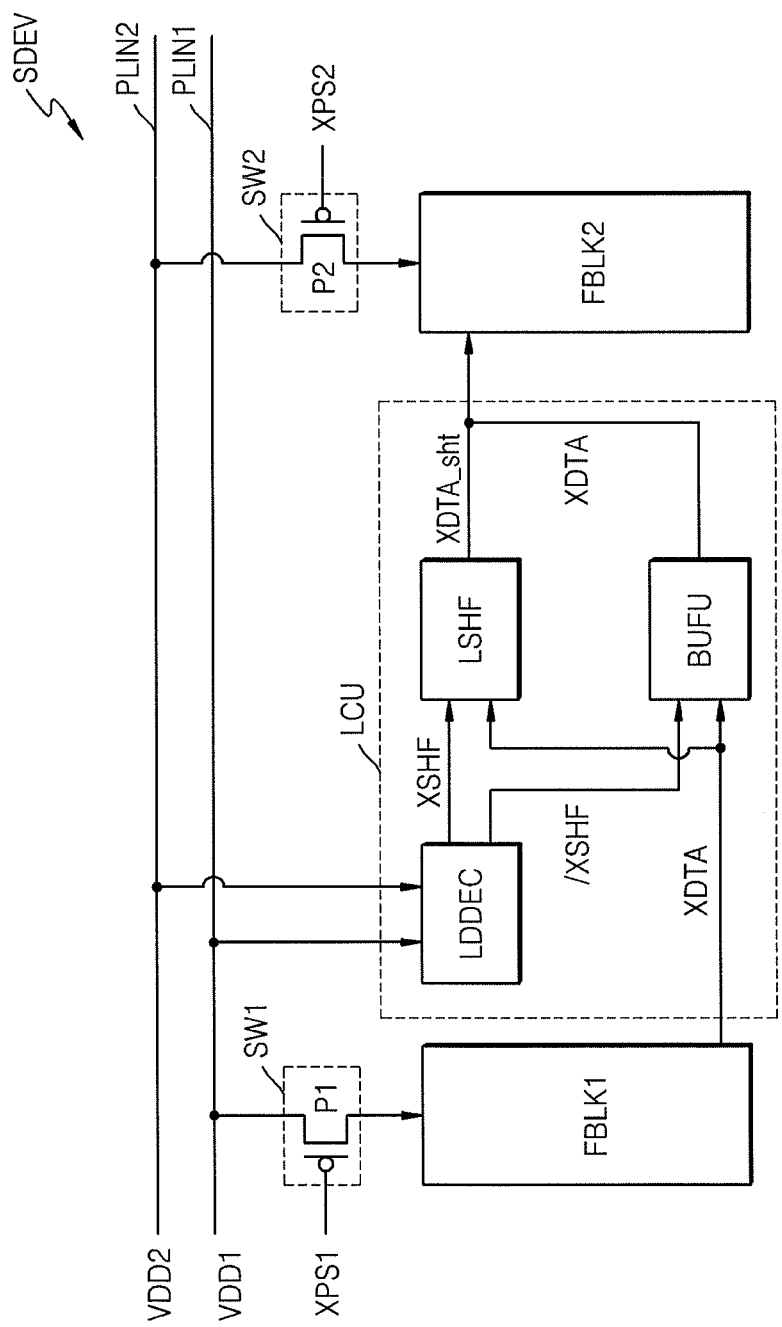
FIG. 1 illustrates a block diagram of an exemplary embodiment of a semiconductor device.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

Like reference numerals in the drawings denote like elements throughout the specification.

FIG. 1 illustrates a block diagram of an exemplary embodiment of a semiconductor device SDEV.

Referring to FIG. 1, the semiconductor device SDEV may include a first function block FBLK1, a second function block FBLK2, and a voltage level control unit LCU. The first function block FBLK1 may operate at a first operation voltage VDD1, and the second function block FBLK2 may operate at a second operation voltage VDD2. The first operation voltage VDD1 may have a voltage value that falls within a first range. The second operation voltage VDD2 may have a voltage value that falls within a second range. Here, the first range and the second range may be different from each other. For example, the first range may be within a range of exactly or about 0.8 volts to exactly or about 1.0 volts, and the second range may be within a range of exactly or about 0.9 volts to exactly or about 1.1 volts. The first range and the second range may overlap.

The first operation voltage VDD1 and the second operation voltage VDD2, which have different ranges from each other, are transmitted through different power lines from each other. In FIG. 1, the first operation voltage VDD1 is applied to the first function block FBLK1 through a first power line PLIN1, and the second operation voltage VDD2 is applied to the second function block FBLK2 through a second power line PLIN2, which is separate from the first power line PLIN1.

In one or more embodiments, the semiconductor device SDEV may further include a first switch unit SW1 via which the first operation voltage VDD1 from the first power line PLIN1 is applied to the first function block FBLK1 in response to a first power signal XPS1. The first switch unit SW1 may be a first P-type metal-oxide silicon (PMOS) transistor P. A first terminal of the first PMOS transistor P1 may be connected to the first power line PLIN1 and a second terminal of the first PMOS transistor P1 may be connected to the first function block FBLK1, and the first power signal XPS1 may be applied to a gate of the first PMOS transistor P1.

In one or more embodiments, the semiconductor device SDEV may further include a second switch unit SW2 via which the second operation voltage VDD2 from the second power line PLIN2 is applied to the second function block FBLK2 in response to a second power signal XPS2. The second switch unit SW2 may be a second PMOS transistor P2. A first terminal of the second PMOS transistor P2 may be connected to the second power line PLIN2, a second terminal of the PMOS transistor P2 may be connected to the second function block FBLK2, and the second power signal XPS2 may be applied to a gate of the second PMOS transistor P2. The first power signal XPS1 and the second power signal XPS2 may be signals for controlling whether or not to apply electric power to the first function block FBLK1 and the second function block FBLK2, respectively. The first power signal XPS1 and the second power signal XPS2 may be the same. The first PMOS transistor P1 and the second PMOS transistor P2 may have the same size.

As stated above, the first function block FBLK1 and the second function block FBLK2 may be set so as to operate at different operation voltages having different ranges from each other.

Figure 2:
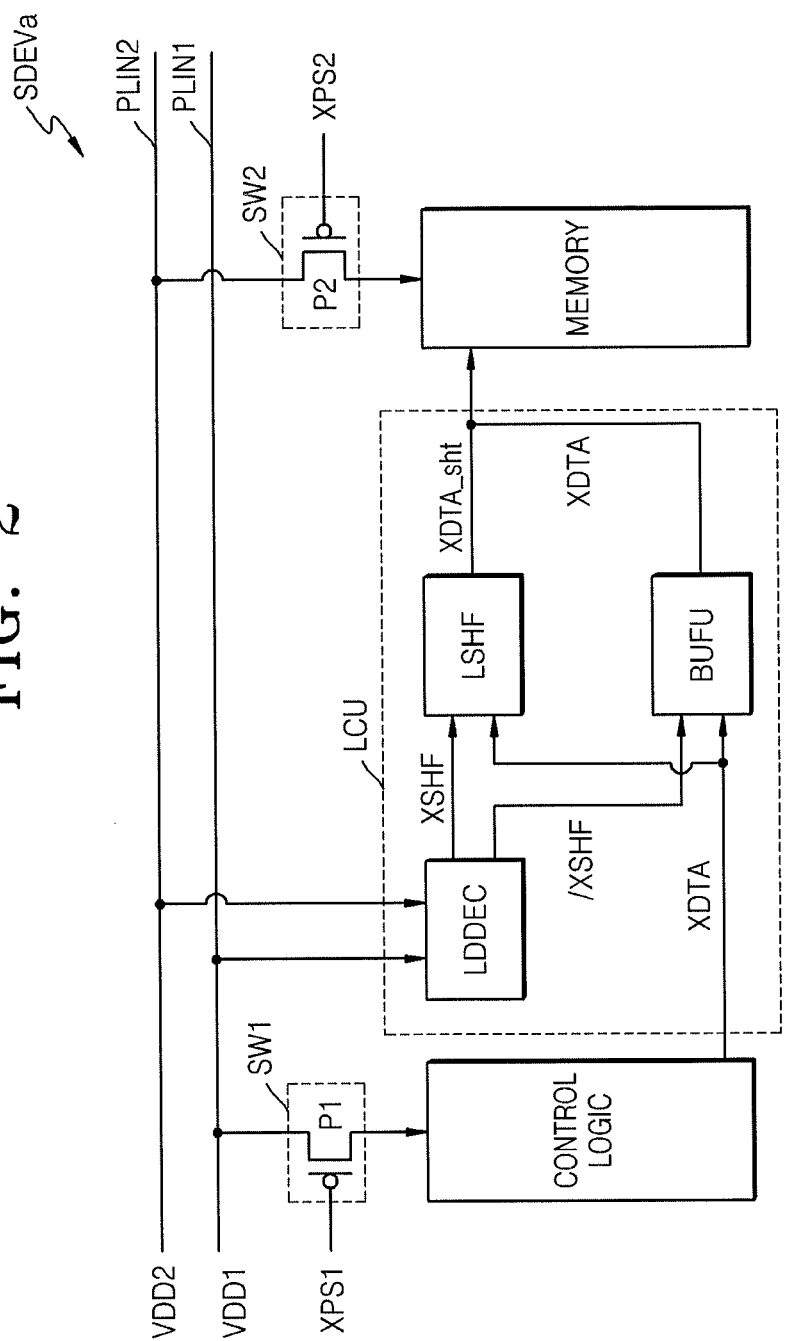
FIG. 2 illustrates a block diagram of the semiconductor device of FIG. 1, including a control logic circuit and a memory as examples of the first function block and the second function block, respectively.

FIG. 2 illustrates a block diagram of a semiconductor device SDEVa, corresponding to the semiconductor device SDEV of FIG. 1 and including a control logic circuit and a memory as examples of the first function block and the second function block thereof, respectively. More particularly, as illustrated in FIG. 2, the first function block FBLK1 may be control logic, and the second function block FBLK2 may be a memory.

In embodiments of the semiconductor device FIG. 2, a data signal XDTA output from the control logic may be data to be stored in the memory, and may include a control signal or an address that is required to store the data in the memory.

However, a minimum value of an operation voltage (the second operation voltage VDD2) of the memory may be higher than that of an operation voltage (the first operation voltage VDD1) of the control logic. In the aforementioned example, a minimum value of the first operation voltage VDD1 may be, e.g., 0.8 volts, whereas a minimum value of the second operation voltage VDD2 may be, e.g., 0.9 volts. In embodiments in which the first operation voltage VDD1 and the second operation voltage VDD2 are different from each other, a level of the data signal XDTA having the first operation voltage VDD1 level needs to be shifted to the second operation voltage VDD2 level to process the data signal XDTA output from the control logic, that is, the first function block FBLK1, as an input of the memory, that is, the second function block FBLK2.

Referring back to FIG. 1, in one or more embodiments, the voltage level control unit LCU may or may not perform a level shifting operation on the data signal XDTA output from the first function block FBLK1 depending on the existence or non-existence of a difference between the first operation voltage VDD1 and the second operation voltage VDD2, and may transmit a level-shifted data signal or the data signal to the second function block FBLK2. For this, the voltage level control unit LCU may include a level detecting unit LDDEC, a level shifter LSHF, and a buffer unit BUFU.

The level detecting unit LDDEC may detect the difference between the first operation voltage VDD1 applied from the first power line PLIN1 and the second operation voltage VDD2 applied from the second power line PLIN2, and may generate a level shifting signal XSHF and a level shifting inversion signal /XSHF having varying logic levels depending on a difference was detected. For example, in the case where the first operation voltage VDD1 and the second operation voltage VDD2 are different from each other, the level detecting unit LDDEC may generate the level shifting signal XSHF having a first logic level and the level shifting inversion signal /XSHF having a second logic level. In the case where the first operation voltage VDD1 and the second operation voltage VDD2 are the same, the level detecting unit LDDEC may generate the level shifting signal XSHF having the second logic level and the level shifting inversion signal /XSHF having the first logic level. The level detecting unit LDDEC may transmit the level shifting signal XSHF to the level shifter LSHF, and may transmit the level shifting inversion signal /XSHF to the buffer unit BUFU.

The level shifter LSHF may be activated by the level shifting signal XSHF having the first logic level, may shift a level of the data signal XDTA from the first operation voltage VDD1 to the second operation voltage VDD2, and may transmit a level-shifted data signal XDTA_sht to the second function block FBLK2. The buffer unit BUFU may transmit the data signal XDTA to the second function block FBLK2 without shifting the level of the data signal XDTA, in response to the level shifting inversion signal /XSHF.

That is, in one or more embodiments, a voltage level control unit LCU may perform a level shifting operation only in the case where the first operation voltage VDD1 and the second operation voltage VDD2 are different from each other. In this manner, by performing the level shifting operation only in the case where operation voltages applied to the function blocks are different from each other, a semiconductor device including one or more such features, e.g., SDEV, SDEVa, may reduce a time delay caused by the level shifting operation, compared to the case of performing the level shifting operation in all cases, and thus, may increase an operation speed of the semiconductor device, e.g., SDEV, SDEVa.

As stated above, the level detecting unit LDDEC of FIG. 1 may generate the level shifting signal XSHF and the level shifting inversion signal /XSHF having varying logic levels depending on whether there is a difference between the first operation voltage VDD1 and the second operation voltage VDD2. Embodiments are not limited thereto.

Figure 3:
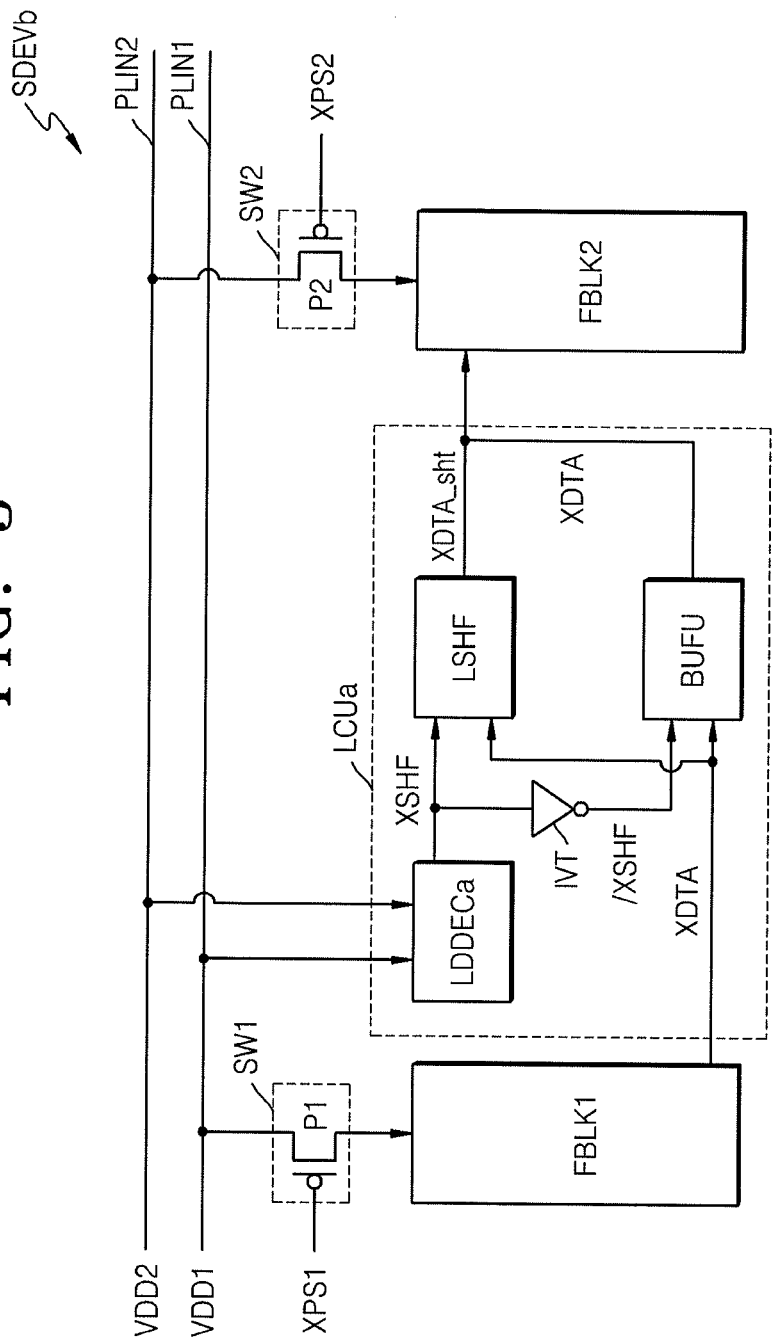
FIGS. 3 and 4 illustrate block diagrams of exemplary embodiments of semiconductor devices.

FIG. 3 illustrates a block diagram of another exemplary embodiment of a semiconductor device SDEVa. In general, only differences between the semiconductor device SDEV of FIG. 1 and the semiconductor device SDEVb of FIG. 3 will be described below. In the exemplary embodiment of FIG. 3, a level detecting unit LDDECa may generate only one of a level shifting signal XSHF or a level shifting inversion signal /XSHF. More particularly, referring to FIG. 3, the level detecting unit LDDECa may generate a level shifting signal XSHF having a varying logic level depending on whether there is a difference between the first operation voltage VDD1 and the second operation voltage VDD2, i.e., may not generate a level shifting inversion signal /XSHF.

Referring to FIG. 3, a voltage level control unit LCUa may include an inverter IVT which generates a level shifting inversion signal /XSHF by inverting a logic level of the level shifting signal XSHF and transmits the level shifting inversion signal /XSHF to the buffer unit BUFU. Although the case where the inverter IVT is a single inverter is illustrated in FIG. 3, embodiments are not limited thereto. The inverter IVT may be a plurality of inverters for inverting the logic level of the level shifting signal XSHF. The level shifter LSHF may shift a voltage level of the first operation voltage VDD1 to a voltage level of the second operation voltage VDD2.

Figure 4:
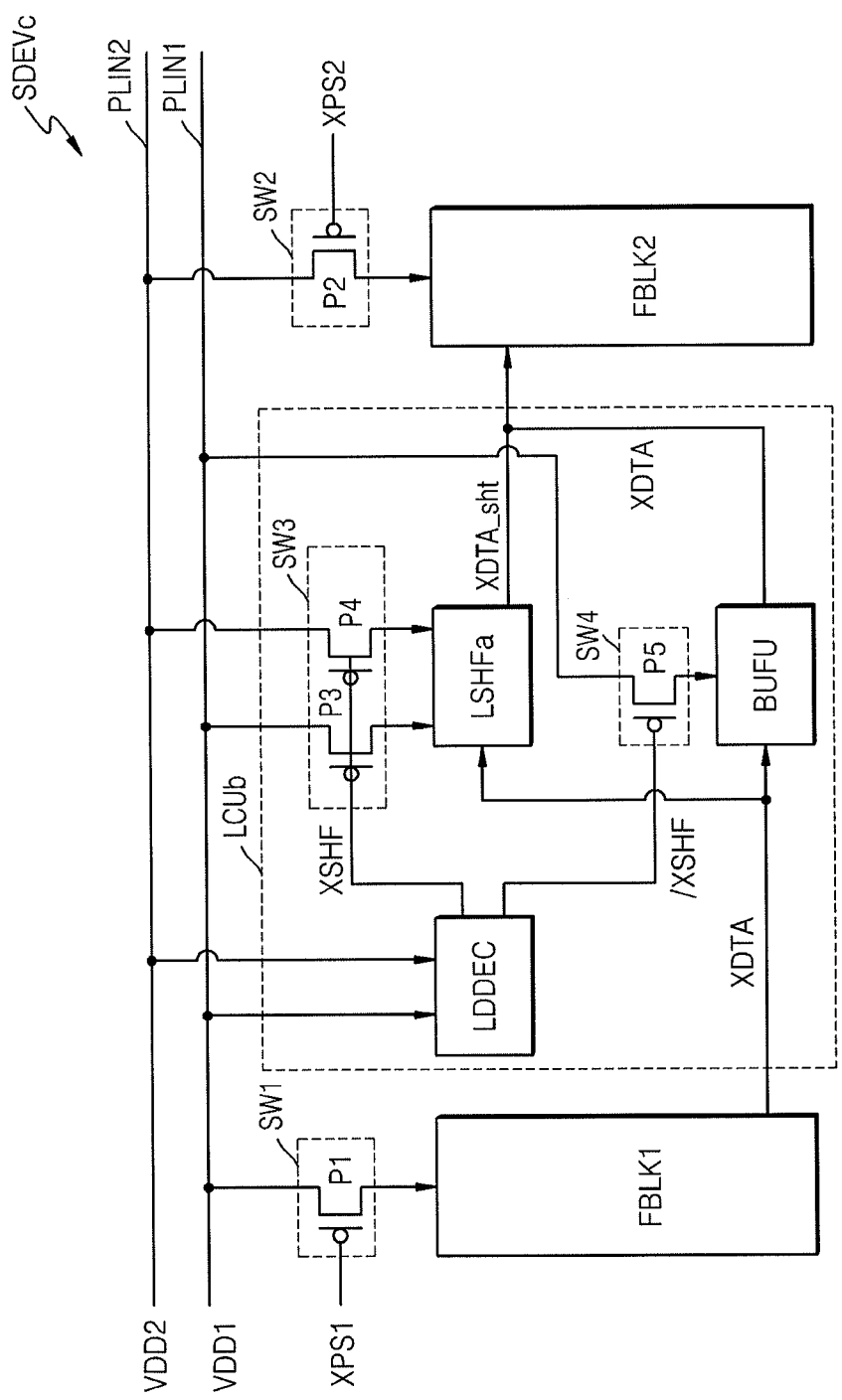

FIG. 4 illustrates a block diagram of another exemplary embodiment of a semiconductor device SDEVc. In general, only differences between the semiconductor device SDEVc of FIG. 4 and the semiconductor device SDEV of FIG. 1 will be described below. A voltage level control unit LCUb may include a third switch unit SW3 and a fourth switch unit SW4.

The third switch unit SW3 may include a third PMOS transistor P3 and a fourth PMOS transistor P4. A level shifter LSHFa, as illustrated in FIG. 4, may change a voltage level of the data signal XDTA based on a difference between the first operation voltage VDD1 and the second operation voltage VDD2 which are applied through the third switch unit SW3. Gates of the third PMOS transistor P3 and the fourth PMOS transistor P4 may be connected to the level shifting signal XSHF. The third PMOS transistor P3 may be located between the first power line PLIN1 and the level shifter LSHF. The fourth PMOS transistor P4 may be located between the second power line PLIN2 and the level shifter LSHF. The third switch unit SW3 may apply the first operation voltage VDD1 and the second operation voltage VDD2 to the level shifter LSHF in response to the level shifting signal XSHF having the first logic level.

The fourth switch unit SW4 may include a fifth PMOS transistor P5 having one terminal connected to the first operation voltage VDD1, another terminal connected to the buffer unit BUFU, and a gate terminal connected to the level shifting inversion signal /XSHF. That is, the fourth switch unit SW4 may control an activation of the buffer unit BUFU in response to the level shifting inversion signal /XSHF. Although FIG. 4 illustrates an exemplary embodiment in which one terminal of the fifth PMOS transistor P5 of the fourth switch unit SW4 is connected to the first operation voltage VDD1, embodiments are not limited thereto. Because the buffer unit BUFU is activated when the first operation voltage VDD1 and the second operation voltage VDD2 are the same, the buffer unit BUFU may perform the same function although the one terminal of the fifth PMOS transistor P5 is connected to the second operation voltage VDD2.

Figure 5:
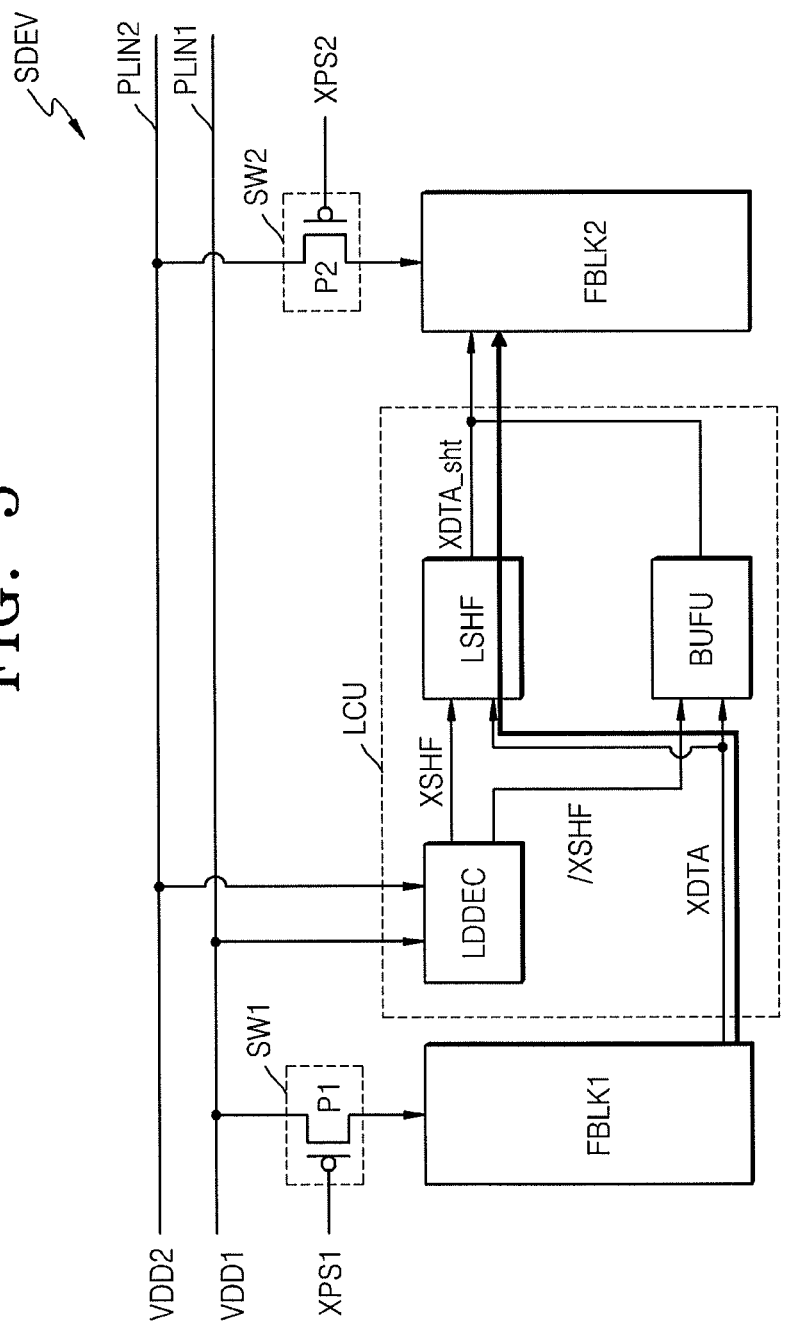
FIGS. 5 and 6 illustrate schematic diagrams for explaining exemplary operations of the semiconductor device of FIG. 1.

FIG. 5 illustrates a schematic diagram for explaining an exemplary operation of the semiconductor device SDEV of FIG. 1 in a state where the first operation voltage VDD1 and the second operation voltage VDD2 are different from each other.

Referring to FIG. 5, when the first power signal XPS1 has a logic low level, the first PMOS transistor P1 is turned on, and thus, the first operation voltage VDD1 is applied to the first function block BLK1 from the first power line PLIN1. In addition, when the second power signal XPS2 has a logic low level, the second PMOS transistor P2 is turned on, and thus, the second operation voltage VDD2 is applied to the second function block BLK2 from the second power line PLIN2. Accordingly, the first function block FBLK1 operates with the first operation voltage VDD1, and the second function block FBLK2 operates with the second operation voltage VDD2. Therefore, the first function block FBLK1 may generate the data signal XDTA having the same voltage level as that of the first operation voltage VDD1.

The level detecting unit LDDEC of the voltage level control unit LCU detects the difference between the first operation voltage VDD1 applied from the first power line PLIN1 and the second operation voltage VDD2 applied from the second power line PLIN2. In the case where the first operation voltage VDD1 and the second operation voltage VDD2 are different from each other, the level detecting unit LDDEC transmits the level shifting signal XSHF having a first logic level to the level shifter LSHF, and transmits the level shifting inversion signal /XSHF having a second logic level to the buffer unit BUFU. The level shifter LSHF is activated in response to the level shifting signal XSHF having the first logic level, and the buffer unit BUFU is deactivated in response to the level shifting inversion signal /XSHF having the second logic level. Accordingly, the voltage level of the data signal XDTA is shifted to the voltage level of the second operation voltage VDD2 by the level shifter LSHF, and a level-shifted data signal XDTA_sht is transmitted to the second function block FBLK2. The second function block FBLK2 performs a corresponding operation in response to the level-shifted data signal XDTA_sht. In the case where the second function block FBLK2 is a memory, as shown in FIG. 2, the second function block FBLK2 may receive and store the level-shifted data signal XDTA_sht.

Figure 6:
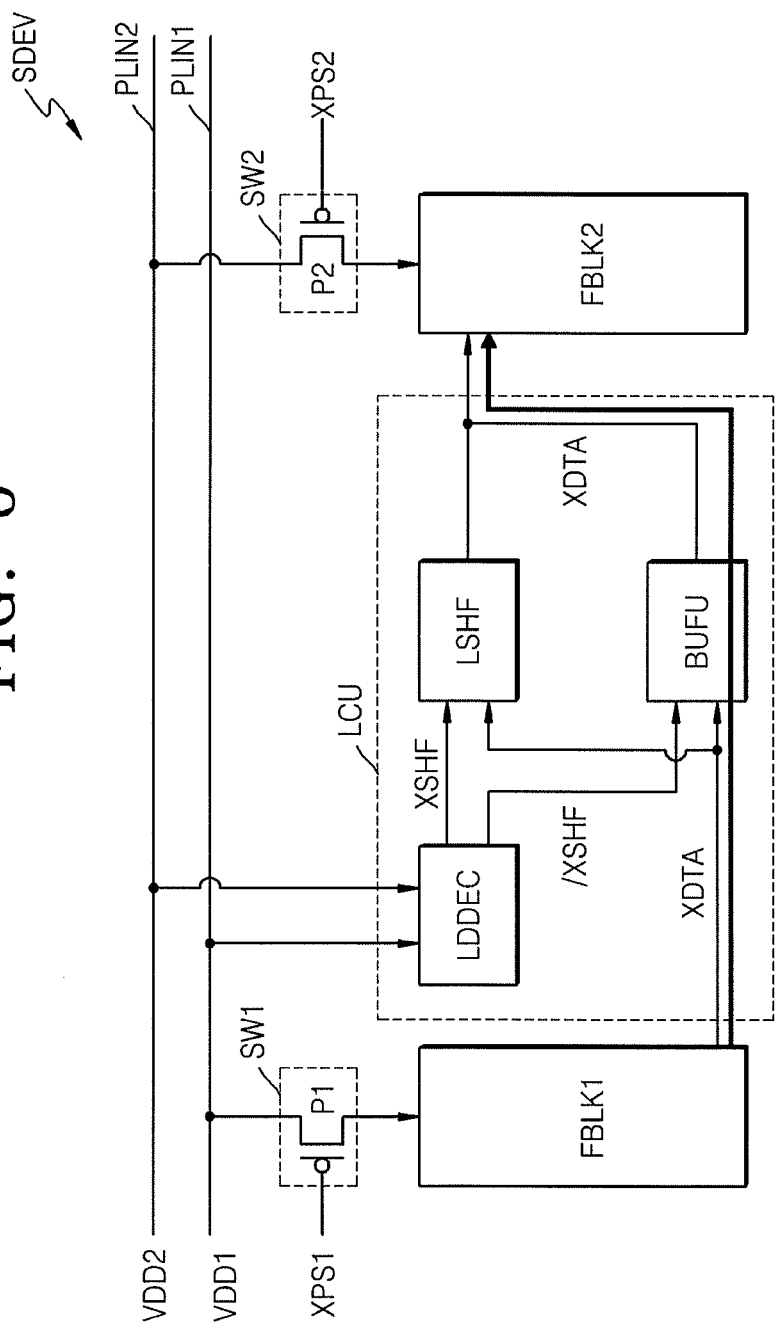

FIG. 6 illustrates a schematic diagram for explaining an exemplary operation of the semiconductor device SDEV of FIG. 1 in a state where the first operation voltage VDD1 and the second operation voltage VDD2 are the same.

Referring to FIG. 6, when the first operation voltage VDD1 and the second operation voltage VDD2 are the same, the level detecting unit LDDEC transmits the level shifting signal XSHF having a second logic level to the level shifter LSHF and transmits the level shifting inversion signal /XSHF having a first logic level to the buffer unit BUFU. The level shifter LSHF is deactivated in response to the level shifting signal XSHF having the second logic level, and the buffer unit BUFU is activated in response to the level shifting inversion signal /XSHF having the first logic level. Accordingly, the data signal XDTA is transmitted to the second function block FBLK2 without changing the voltage level thereof. Because a level shifting operation for the data signal XDTA is not required in the case where the first operation voltage VDD1 and the second operation voltage VDD2 are the same, one or more embodiments of the semiconductor device SDEV transmit the data signal XDTA to the second function block FBLK2 without any change.

Figure 7:
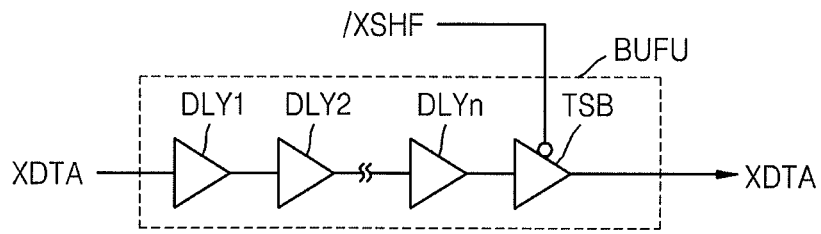
FIG. 7 illustrates a circuit diagram of an exemplary embodiment of the buffer unit of FIG. 1.

FIG. 7 illustrates a circuit diagram of an exemplary embodiment of the buffer unit BUFU of FIG. 1.

Referring to FIG. 7, the buffer unit BUFU may include a plurality of delays DLY1 through DLYn connected serially to each other and a tri-state buffer TSB. The tri-state buffer TSB may receive an output of the delayer DLYn, which is located in the last stage of the plurality of serially connected delays DLY1 through DLYn. The tri-state buffer TSB may be activated by the level shifting inversion signal /XSHF and may output the data signal XDTA.

Figure 8:
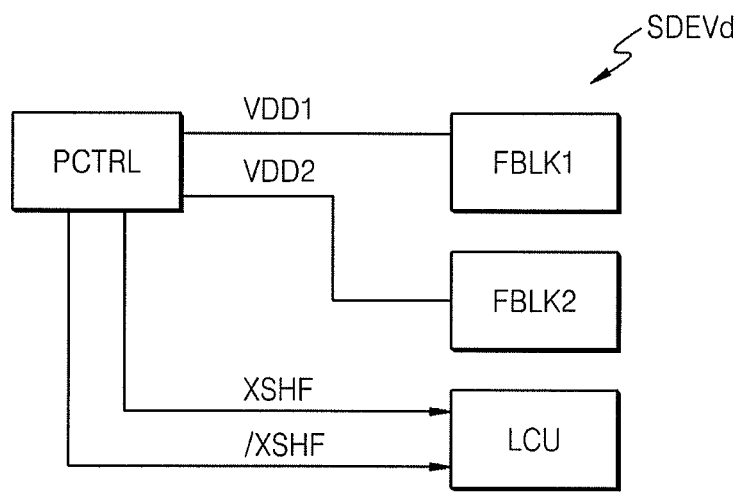
FIGS. 8 and 9 illustrate block diagrams of exemplary embodiments of a semiconductor device in which a level shifting signal is generated from a power controller.
Figure 9:
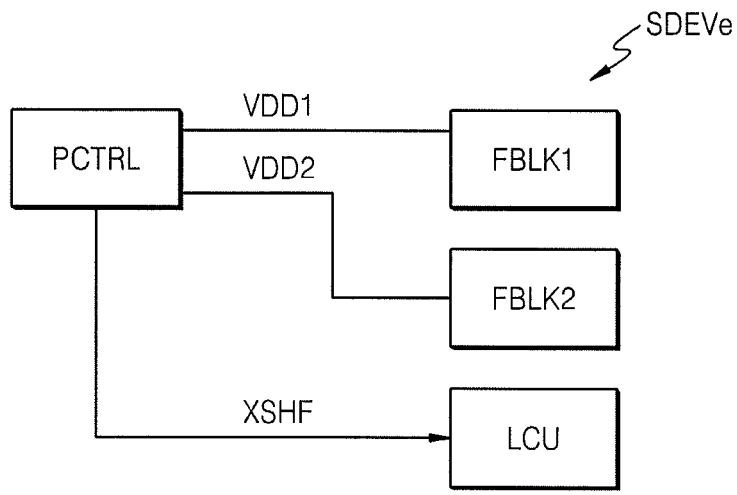

FIGS. 8 and 9 illustrate block diagrams of exemplary embodiments of semiconductor devices SDEVd, SDEVe in which a level shifting signal is generated by a power controller. In general, only differences between the semiconductor device SDEV of FIG. 1 and the semiconductor devices SDEVd, SDEVe of FIGS. 8 and 9 will be described below.

Referring to FIG. 8, the semiconductor device SDEV may further include a power controller PCTRL for applying the first operation voltage VDD1 to the first function block FBLK1 and applying the second operation voltage VDD2 to the second function block FBLK2. Here, the power controller PCTRL may apply the first operation voltage VDD1 to the first function block FBLK1 through the first power line PLIN1 of FIG. 1, and may apply the second operation voltage VDD2 to the second function block FBLK2 through the second power line PLIN2 of FIG. 1. The voltage level control unit LCU of FIG. 8, similar to the voltage level control unit LCU of FIG. 1, may or may not perform a level shifting operation depending on the existence or non-existence of a difference between the first operation voltage VDD1 and the second operation voltage VDD2. However, in the semiconductor device SDEVd of FIG. 8, the level shifting signal XSHF and the level shifting inversion signal /XSHF may be generated from the power controller PCTRL.

The power controller PCTRL may detect voltage levels of the first operation voltage VDD1 and the second operation voltage VDD2 and may generate the level shifting signal XSHF by determining a difference between the voltage levels. In this case, the voltage level control unit LCU of FIG. 8, differently from the voltage level control unit LCU of FIG. 1, may not include the level detecting unit LDDEC.

Referring to FIG. 9, in another exemplary embodiment, a power controller PCTRLa may transmit only the level shifting signal XSHF to the voltage level control unit LCU. In such embodiments, the semiconductor device SDEVe may include the voltage level control unit LCUa of FIG. 3 including an inverter IVT to invert a logic level of the level shifting signal XSHF, which is transmitted with a single logic level.

While only examples in which the data signal XDTA is transmitted from the first function block FBLK1 to the second function block FBLK2 have been described, embodiments are not limited thereto. For example, FIG. 10 illustrates a block diagram of an exemplary embodiment of a semiconductor device SDEVf in which a data signal is transmitted from a second function block to a first function block.

Figure 10:
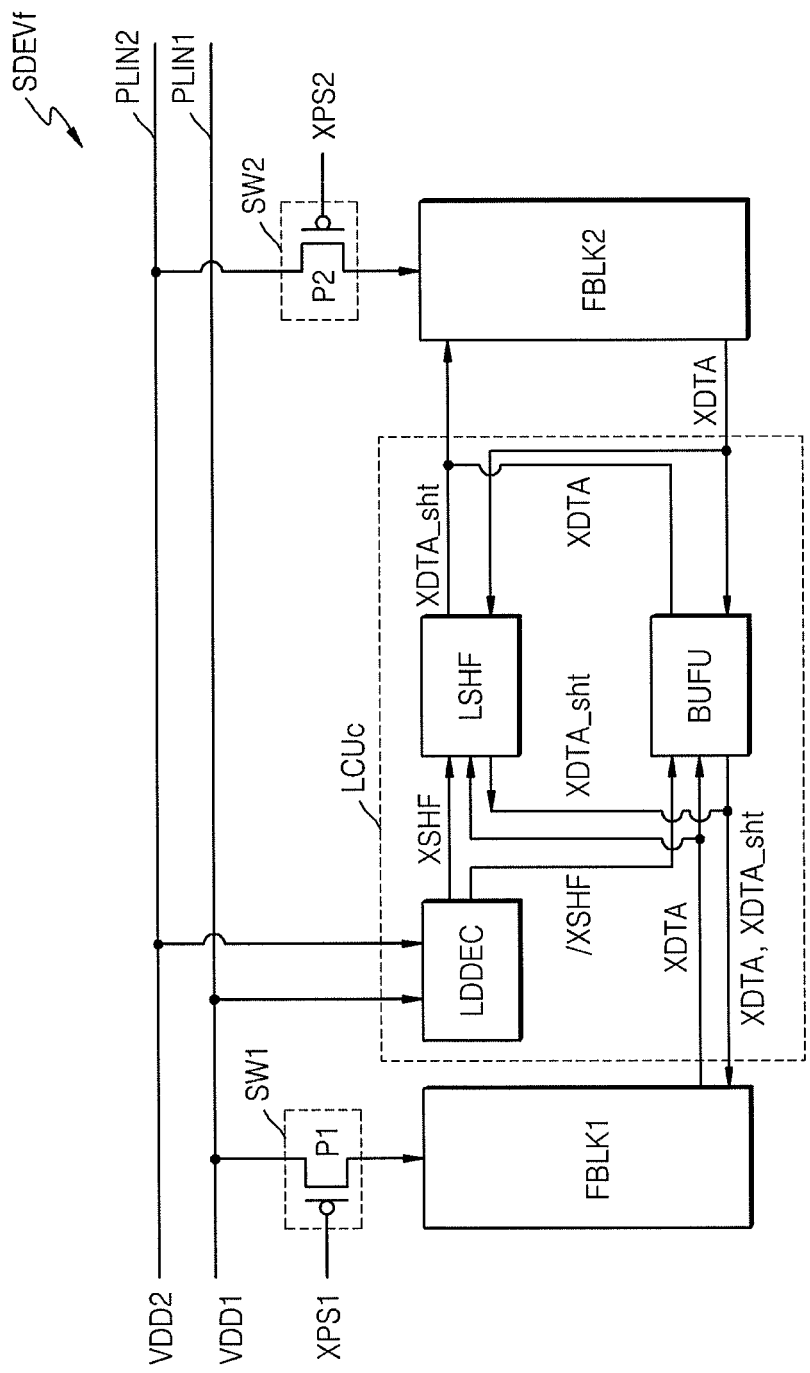
FIG. 10 illustrates a block diagram of an exemplary embodiment of a semiconductor device in which a data signal is transmitted from a second function block to a first function block.

Referring to FIG. 10, in one or more embodiments, the data signal XDTA may be transmitted from the second function block FBLK2 to the first function block FBLK1. More particularly, referring to FIG. 10, in one or more embodiments, a voltage level control unit LCUc may be configured to transmit the data signal SDTA from the first function block FBLK1 to the second function block FBLK2 as well as from the second function block FBLK2 to the first function block FBLK1. Like the example of FIG. 2, in embodiments in which the first function block FBLK1 is control logic and the second function block FBLK2 is a memory, the data signal XDTA may be transmitted to the control logic as data read from the memory.

In embodiments in which the data signal XDTA is transmitted from the second function block FBLK2 to the first function block FBLK1, similar to the case of FIG. 1, one of the level shifter LSHF and the buffer unit BUFU may be activated according to a logic level of the level shifting signal XSHF indicating the existence of the difference between the first operation voltage VDD1 and the second operation voltage VDD2. Accordingly, depending on the existence of a difference between the first operation voltage VDD1 and the second operation voltage VDD2, the voltage level of the data signal XDTA output from the second function block FBLK2 will be shifted or maintained, and then a level-shifted data signal XDTA_sht or the data signal XDTA (data that is not level shifted, i.e., maintained data signal) will be transmitted to the first function block FBLK1.

Referring to FIG. 10, the first function block FBLK1 may receive the level-shifted data signal XDTA_sht or the data signal XDTA (data that is not level shifted, i.e., maintained data signal), and may perform a corresponding operation. Like the example of FIG. 2, in embodiments in which the data signal XDTA is data read from the memory, the first function block FBLK1 may perform an operation for transmitting the read data to an external host device (not shown).

In such embodiments, e.g., a semiconductor device including function blocks operating at operation voltages having different voltage ranges from each other has been explained. However, the inventive concept is not limited thereto. Function blocks included in the semiconductor device according to the inventive concept may operate at operation voltages having the same voltage range, as described as follows.

Figure 11:
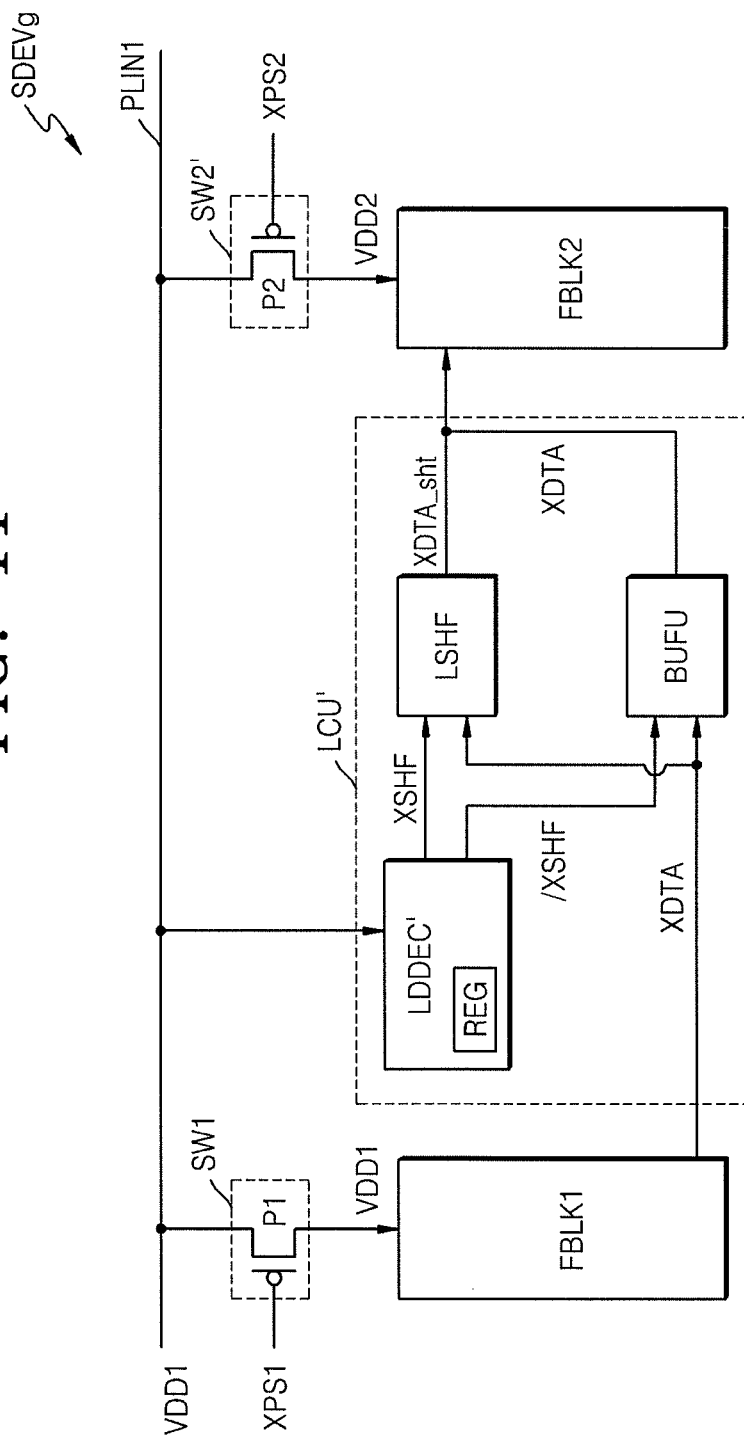
FIGS. 11 through 13 illustrate block diagrams of exemplary embodiments of semiconductor devices including function blocks operating at operation voltages having a same voltage range.
Figure 12:
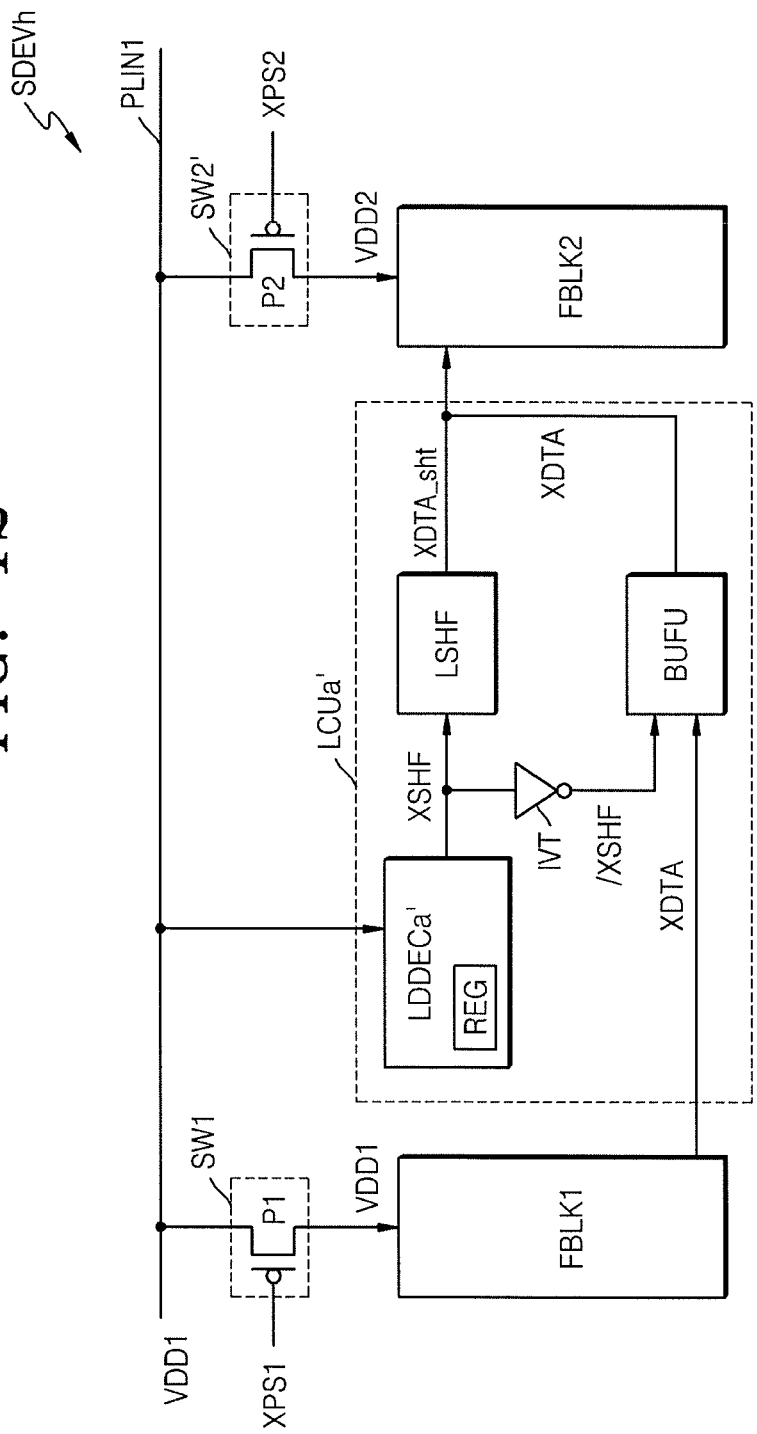
Figure 13:
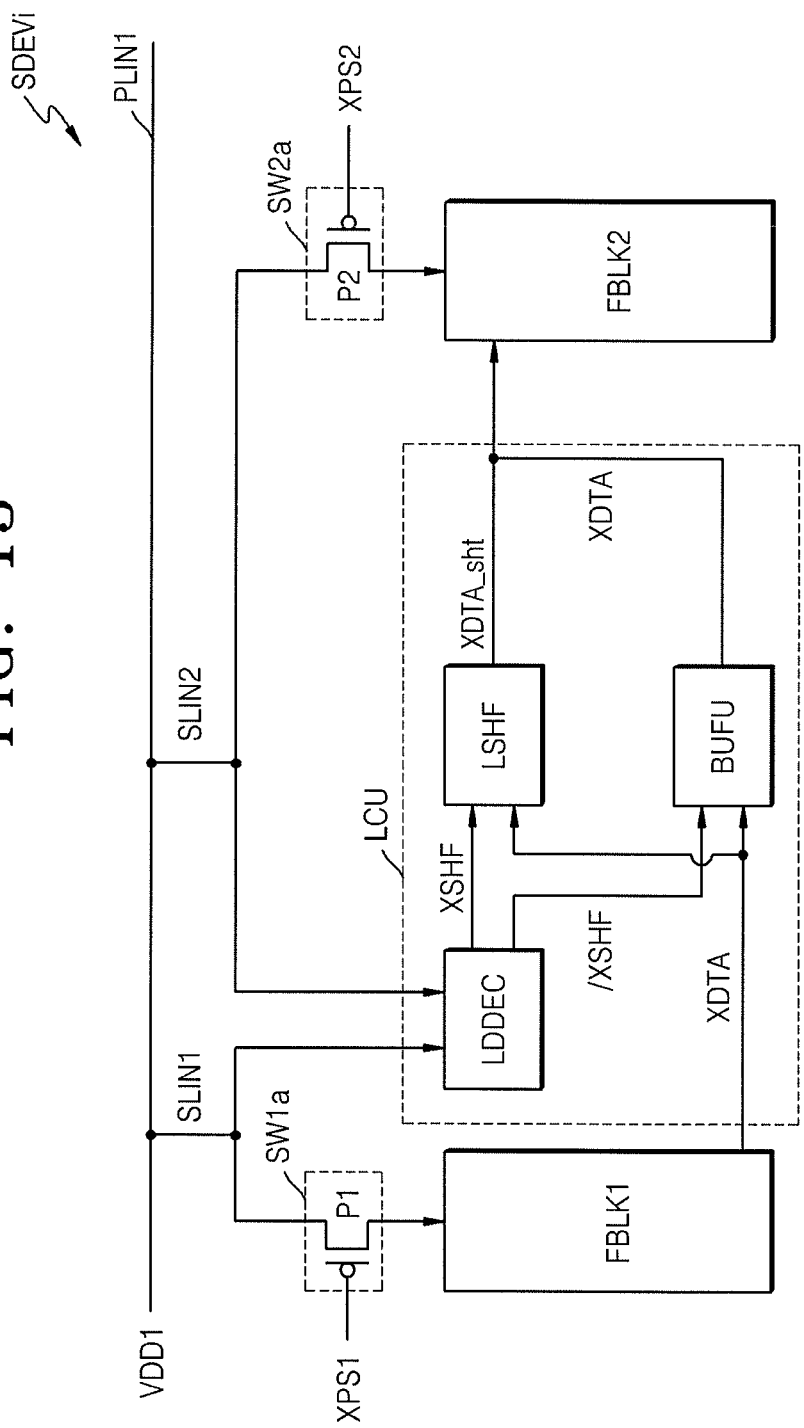

FIGS. 11 through 13 illustrate block diagrams of exemplary embodiments of semiconductor devices SDEVg, SDEVh, SDEVi including function blocks operating at operation voltages having a same voltage range. In general, only differences will be described below, as like reference numerals refer to like elements throughout the specification.

Referring to FIG. 11, operation voltages of a first function block FBLK1 and a second function block FBLK2 of the semiconductor device SDEVg may have the same voltage range. For example, the operation voltage of the first function block FBLK1 and the operation voltage of the second function block FBLK2 may be a first operation voltage VDD1. Accordingly, the semiconductor device SDEVg of FIG. 11 may include the first switch unit SW1 and a second switch unit SW2', which apply the first operation voltage VDD1 transferred through a single power line, e.g., the first power line PLIN1, both to the first function block FBLK1 and the second function block FBLK2. Here, the first switch unit SW1 and the second witch unit SW2, like in FIG. 1, may each include a gate terminal configured to received a first power signal XPS1 and a second power signal XPS2, respectively.

However, the first operation voltage VDD1 applied to the second function block FBLK2 may be different from the first operation voltage VDD1 applied to the first function block FBLK1. Below, an operation voltage applied to the second function block FBLK2 with a different voltage level from the first operation voltage VDD1 is represented as a second operation voltage VDD2. That is, e.g., due to various factors, the second operation voltage VDD2 may be different from the first operation voltage VDD1.

For example, due to time variations, a voltage level of the first operation voltage VDD1 may fall or rise to that of the second operation voltage VDD2. For example, the voltage level of the first operation voltage VDD1 generated from the power controller PCTRL of FIG. 8 may not be uniformly applied to the first function block FBLK1 and the second function block FBLK2, and the voltage level of the first operation voltage VDD1 may fall due to the resistance of the first power line PLIN1 as the first function block FBLK1 and the second function block FBLK2 are located apart from each other by a relatively large distance. In addition, the voltage level of the first operation voltage VDD1 may fall or rise to that of the voltage level of the second operation voltage VDD2 according to the operation of the first function block FBLK1. For example, in the case where the first function block FBLK1 consumes a lot of electrical power temporarily, the voltage level of the first operation voltage VDD1, which should be applied to the second function block FBLK2, may vary.

Thus, e.g., a variance in voltage level of an operation voltage may have a negative effect on a stable operation of the semiconductor device SDEVg. The reason is that when the data signal XDTA generated with the first operation voltage VDD1 is transmitted to the second function block FBLK2, the data signal XDTA may not be processed normally in the case where an operation voltage of the second function block FBLK2 is changed into the second operation voltage VDD2. Accordingly, the reliability of the semiconductor device SDEVg may deteriorate. One or more embodiments of the semiconductor device SDEVg may include a voltage level control unit LCU', and in the case where a level of the operation voltage varies, the voltage level control unit LCU' may compensate for a varying voltage level.

The voltage level control unit LCU' of FIG. 11, similar to FIG. 1, may include a level detecting unit LDDEC', the level shifter LSHF, and the buffer unit BUFU. Because operations of the level shifter LSHF and the buffer unit BUFU are the same, an explanation for the operations thereof will not be repeated. However, the level detecting unit LDDEC' of FIG. 11, differently from the level detecting unit LDDEC of FIG. 1, receives a voltage from a single power line, namely, the first power line PLIN1. In addition, the level detecting unit LDDEC' of FIG. 11 may detect a difference between two voltages applied from the first power line PLIN1 at two points of time. Accordingly, the level detecting unit LDDEC' of FIG. 11 may detect whether a voltage level of the first operation voltage VDD1 at a first point of time is changed into a voltage level of the second operation voltage VDD2 at a second point of time. Here, the level detecting unit LDDEC' of FIG. 11 may include a storing unit such as a register REG to store a voltage of the first power line PLIN11 at the first point of time.

A time interval between the first point of time and the second point of time may be set arbitrarily. For example, the level detecting unit LDDEC' may set a time required to generate the data signal XDTA by the first function FBLK1 to the time interval between the first point of time and the second point of time.

The level detecting unit LDDEC' of FIG. 11 may apply the level shifting signal XSHF having the first logic level to the level shifter LSHF when the voltages of the first power line PLIN1 detected at different points of time are different from each other, and may transmit the level shifting inversion signal /XSHF having the second logic level to the buffer unit BUFU when the voltages of the first power line PLIN1 detected at the different points of time are the same. Accordingly, a level shifting operation may be performed only in the case where the voltages of the first power line PLIN1 detected at the different points of time are different from each other as a result of, e.g., different activations between the level shifter LSHF and the buffer unit BUFU, that is, only in the case where the voltage level of the first operation voltage VDD1 at the first point of time is different from the voltage level of the second operation voltage VDD2 at the second point of time. A voltage variation of the first operation voltage VDD1 may be compensated for by the level shifting operation, and thus, the semiconductor device SDEVg may be operated stably. In addition, in the case where the voltage variation of the first operation voltage VDD1 does not occur, the level shifting operation is not performed, and thus, an unnecessary time delay of the semiconductor device SDEVg may be reduced.

Referring to FIG. 12, the semiconductor device SDEVh may include a level control unit LCUa' including a level detecting unit LDDECa'. The level detecting unit LDDECa' may generate only the level shifting signal XSHF having a different logic level depending on the existence of a difference between the voltages of the first power line PLIN1, which are detected at the different points of time from each other. The level shifting signal XSHF is applied to the level shifter LSHF. In addition, the semiconductor device SDEVh of FIG. 12, similar to the semiconductor device SDEVb of FIG. 3, may further include the inverter IVT that generates a level shifting inversion signal /XSHF by inverting the level shifting signal XSHF and transmits the level shifting inversion signal /XSHF to the buffer unit BUFU.

In the semiconductor devices SDEVg, SDEVh of FIGS. 11 and 12, a voltage is applied from the first power line PLIN1 to the level detecting unit LDDEC through a single line, whereas in the semiconductor device SDEVi of FIG. 13, a voltage may be applied from the first power line PLIN1 to the level detecting unit LDDEC through different lines, namely, a first and second power lines SLIN1 and SLIN2 and/or a first switch unit SW1a and a second switch unit SW2a, respectively. The semiconductor device SDEVi of FIG. 13 may detect voltage levels through the different lines. Thus, in cases in which the first function block FBLK1 and the second function block FBLK2 are located apart from each other by a relatively large distance, the semiconductor device SDEVi may accurately detect a voltage level variation between the voltages at the different points of time of the first power line PLIN1.

Figure 14:
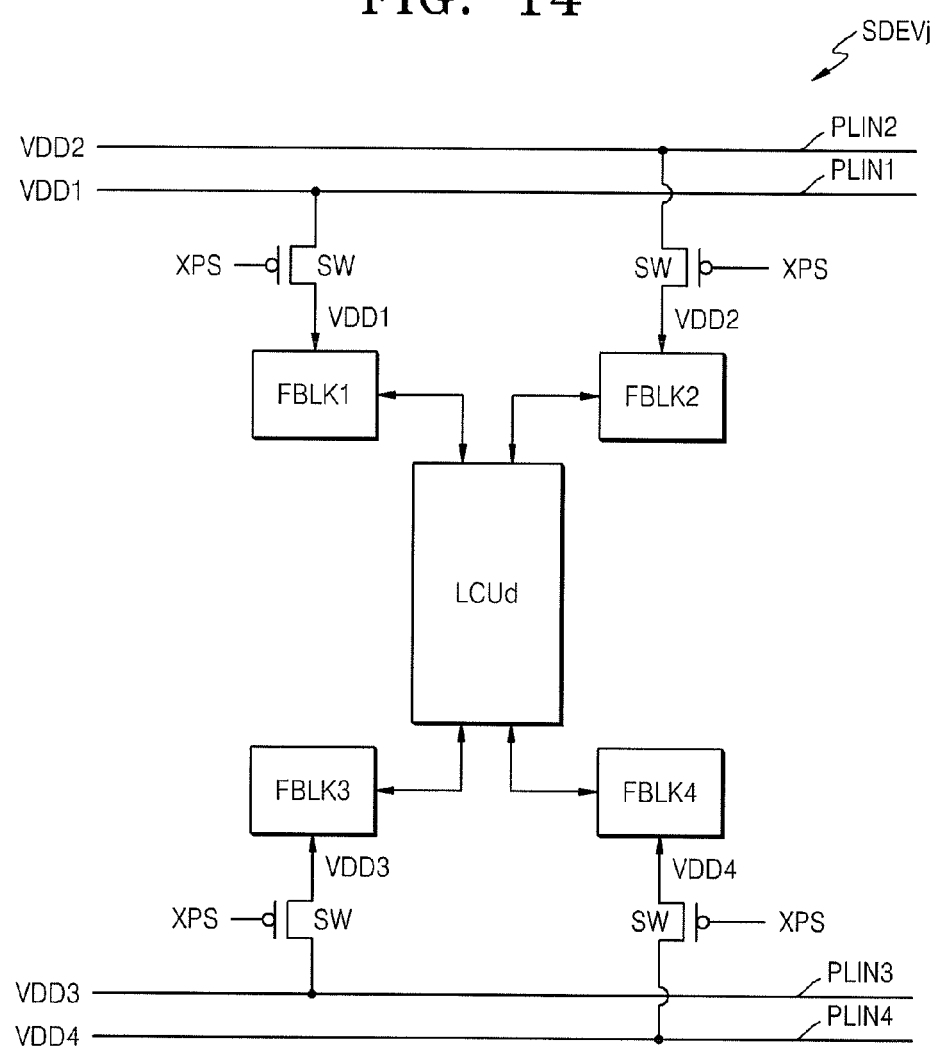
FIGS. 14 and 15 illustrate block diagrams of exemplary embodiments of semiconductor devices including four function blocks.
Figure 15:
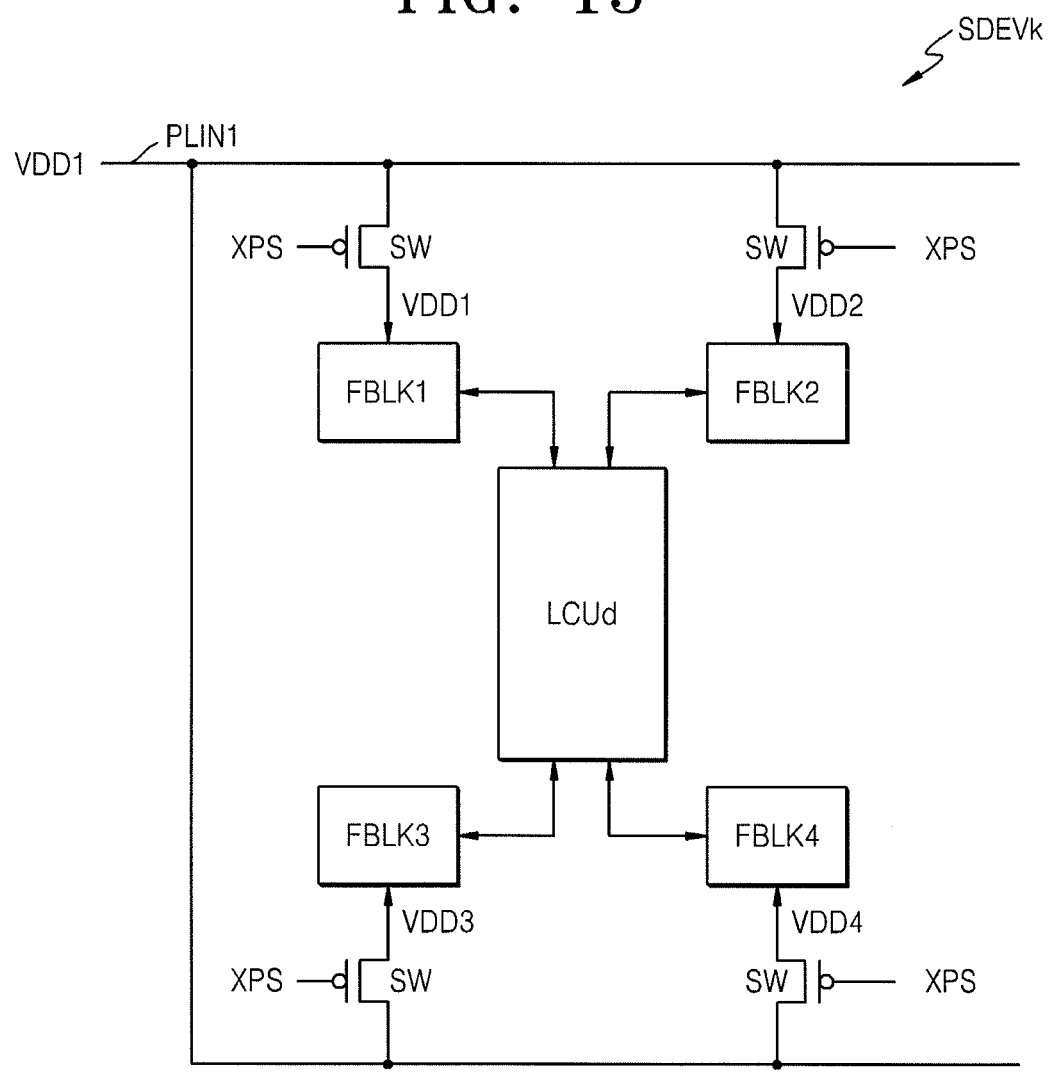

FIGS. 14 and 15 illustrate block diagrams of exemplary embodiments of semiconductor devices SDEVj, SDEVk including more than two, e.g., four, function blocks.

Referring to FIG. 14, the semiconductor device SDEVj may include the first function block FBLK1, the second function block FBLK2, a third function block FBLK3 operating at a third operation voltage VDD3 having a third range and a fourth function block FBLK4 operating at a fourth operation voltage VDD4 having a fourth range, and a voltage level control unit LCUd. Ranges of the first through fourth operation voltages VDD1 through VDD4, e.g., the first through fourth ranges, may be different from each other. In this case, through different power lines, namely, first through fourth power lines PLIN1 through PLIN4, corresponding operation voltages may be applied to corresponding function blocks, respectively.

The voltage level control unit LCUd of FIG. 14 may detect a difference between at least two operation voltages of the first through fourth operation voltages VDD1 through VDD4, and only in the case where the difference exists, may compensate for a voltage level corresponding to the difference, before perform transmitting and receiving of data signals between the first through fourth function blocks FBLK1 through FBLK4. The voltage level control unit LCUd may be shared by the first through fourth function blocks FBLK1 through FBLK4. However, embodiments are not limited thereto. For example, voltage level control units for controlling voltage levels between the function blocks may be prepared separately. More particularly, e.g., a first voltage level control unit (not shown) for shifting a voltage level difference between the first function block FBLK1 and the second function block FBLK2 and a second voltage level control unit (not shown) for shifting a voltage level difference between the second function block FBLK2 and the third function block FBLK3 may be prepared separately.

Referring to FIG. 15, in the exemplary semiconductor device SDEVk illustrated therein, ranges of the first through fourth operation voltages VDD1 through VDD4 of the first through fourth function blocks FBLK1 through FBLK4 are set to be the same (like the semiconductor device SDEVg of FIG. 11). Exemplary reasons why a voltage level difference between the first through fourth function blocks FBLK1 through FBLK4 maybe generated although the first through fourth function blocks FBLK1 through FBLK4 are set so as to operate at the same operation voltage, that is, the first operation voltage VDD1, may be the same as those explained for FIG. 11. Further, the semiconductor device SDEVk of FIG. 15 may include a larger number of function blocks than that of the semiconductor device SDEVg of FIG. 11. In a semiconductor device including a large number of function blocks, damage due to variations of an operation voltage, e.g., a rapid increase of power consumption in each of the function blocks may become more serious. For example, in the case where the power consumption increases rapidly in the first function block FBLK1, a normal operation voltage may not be applied to the other function blocks FBLK2 through FBLK4 to which the same operation voltage VDD1 is applied through the same power line PLIN1. That is, in the case where the power consumption increases rapidly in the first function block FBLK1, a voltage level of the first power line PLIN1 falls rapidly, and operation voltages applied to the other function blocks FBLK2 through FBLK4 may be different from the first operation voltage VDD1.

However, one or more embodiments of semiconductor devices including one or more features described herein, e.g., SDEVk, may perform a stable operation by compensating for (in other words, shifting) a voltage variation on the power line induced due to a voltage variation in any function block, and thus, the reliability of the semiconductor device may be ensured. The voltage level control unit LCU of FIG. 15, as explained in FIG. 14, may be shared by all function blocks, or corresponding voltage level control units may be prepared separately between function blocks.

Figure 16:
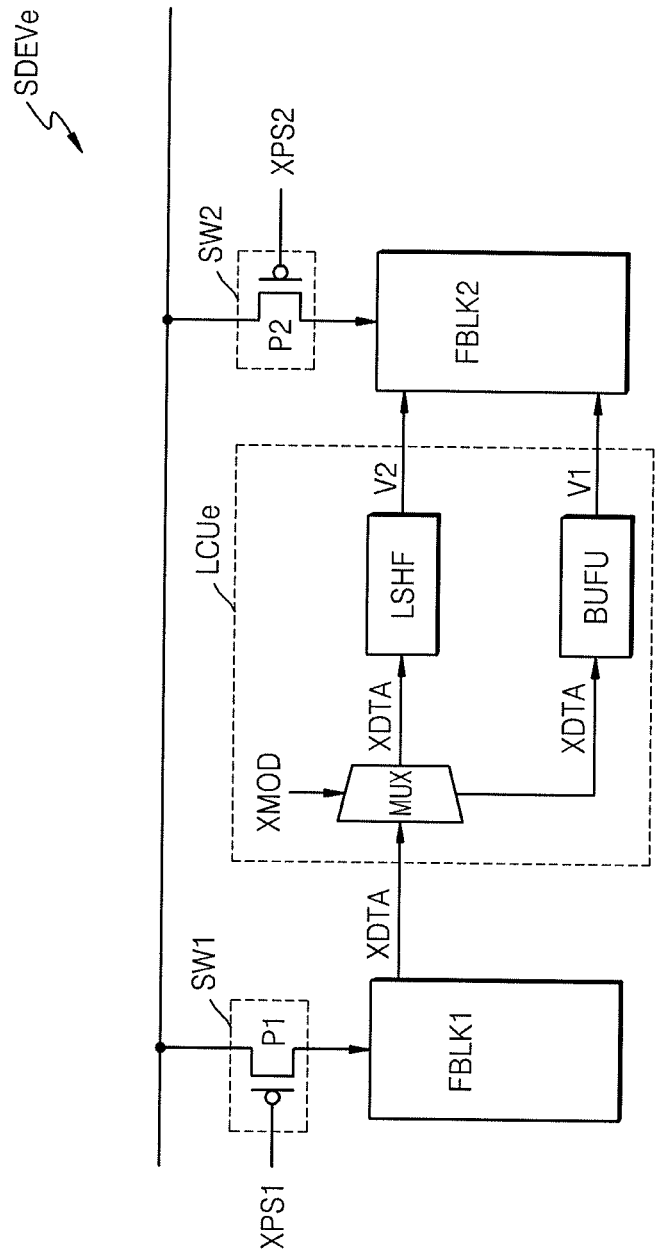
FIG. 16 illustrates a block diagram of an exemplary embodiment of a semiconductor device including function blocks operating at different operation characteristics.

FIG. 16 illustrates a block diagram of a semiconductor device SDEVe including function blocks operating at different operating characteristics from each other.

Referring to FIG. 16, the semiconductor device SDEVe of FIG. 16, similar to the semiconductor devices SDEV, SDEVg of FIGS. 1 and 11, may include the first function block FBLK1 for outputting a data signal XDTA and the second function block FBLK2 for receiving the data signal XDTA. A voltage level control unit LCUe of FIG. 16, similar to the voltage level control units LCU, LCU' of FIGS. 1 and 11, may include a level shifter LSHF and a buffer unit BUFU. However, the voltage level control unit LCU of FIG. 1 controls whether or not to perform a level shifting on the data signal XDTA output from the first function block FBLK1, depending on the existence of a difference between the first operation voltage VDD1 and the second operation voltage VDD2 applied from different power lines PLIN1 and PLIN2 from each other. The voltage level control unit LCU' of FIG. 11 controls whether or not to perform a level shifting on the data signal XDTA output from the first function block FBLK1, according to a variation, induced due to a time variation, of an operation voltage applied from a single power line PLIN1.

The voltage level control unit LCUe of FIG. 16 may receive the data signal XDTA output from the first function block FBLK1 and may transmit an output signal having a first voltage level V1 or a second voltage level V2 to the second function block FBLK2, in response to a mode signal XMOD.

In the voltage level control unit LCUe of FIG. 16, the data signal XDTA output from the first function block FBLK1 may be transmitted to the level shifter LSHF or the buffer unit BUFU in response to the mode signal XMOD. Here, the mode signal XMOD may represent a low speed mode or a high speed mode of the semiconductor device SDEV. For example, a first logic level of the mode signal XMOD may represent the high speed mode, and a second logic level of the mode signal XMOD may represent the low speed mode. In such embodiments, a selector DEMUX may transmit the data signal XDTA output from the first function block FBLK1 to the buffer unit BUFU, in response to the mode signal XMOD having the first logic level. On the other hand, e.g., the selector DEMUX may transmit the data signal XDTA output from the first function block FBLK1 to the level shifter LSHF, in response to the mode signal XMOD having the second logic level.

The buffer unit BUFU, in the high speed mode, may receive the data signal XDTA from the first function block FBLK1 and may transmit an output signal having the first voltage level V1 to the second function block FBLK2. In FIG. 16, the data signal XDTA output from the first function block FBLK1 may be generated and output so that the data signal XDTA has the first voltage level V1, and thus, the buffer unit BUFU may transmit the data signal XDTA having the first voltage level V1 to the second function FBLK2 without changing the voltage level of the data signal XDTA. Accordingly, in the high speed mode, the semiconductor device SDEV may operate at high speed with a high voltage.

The level shifter LSHF, in the low speed mode, may receive the data signal XDTA from the first function block FBLK1, may shift a voltage level of the data signal XDTA from the first voltage level V1 to the second voltage level V2, and may transmit an output signal having the second voltage level V2 to the second function block FBLK2. As stated above, in FIG. 16, the data signal XDTA output from the first function block FBLK1 may be generated and output so that the data signal XDTA has the first voltage level V1. For example, in the case where the first voltage V1 is 3 volts, the level shifter LSHF of FIG. 16 may shift the first voltage V1, that is, 3 volts level to the second voltage V2, for example, 1.5 volts, and thus, in the low speed mode, the semiconductor device SDEV may operate at low speed with a low voltage.

One or more embodiments of a semiconductor device, e.g., SDEVe, may perform easily a voltage level shifting operation according to an operation mode, and thus, may reduce the power consumption of the semiconductor device. In addition, in one or more embodiments of the semiconductor device, e.g., SDEVe, a design change of the semiconductor device SDEVe may be made easily by changing an operation speed, as stated above. In some embodiments, a semiconductor device may be configured to perform a voltage level shifting operation according to an operation mode and/or when a voltage difference between a first operation voltage and a second operation voltage is detected.

Figure 17:
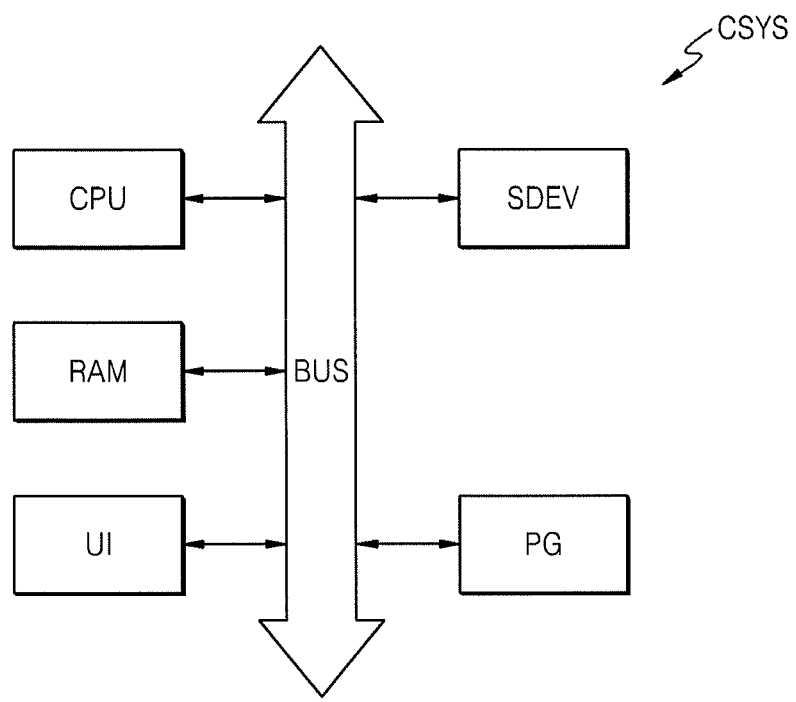
FIG. 17 illustrates a block diagram of an exemplary embodiment of a computing system.

FIG. 17 illustrates a block diagram of a computing system CSYS including a semiconductor device.

Referring to FIG. 17, the computing system CSYS may include a processor CPU, a user interface UI, a system memory RAM, a power supplying device PS, and a semiconductor device SDEV, all of which are connected via a bus BUS. The semiconductor device SDEV may be the semiconductor device SDEV of FIG. 1 or the like. Accordingly, the computing system CSYS may have an increased operation speed by detecting a difference between different operation voltages from each other and selectively performing a level shifting operation, and may stably operate by compensating for a variation of an operation voltage through a level shifting operation or blocking an effect of a voltage variation between a plurality of function blocks. In addition, the computing system CSYS may have reduced power consumption by performing easily a voltage variation operation according to an operation mode through a voltage level shifting operation, and in the computing system CSYS, a design change of the system may be made easily by selecting one of different operation characteristics.

In the case where the computing system CSYS is a mobile device, the computing system CSYS may further include a battery for supplying an operation voltage to the computing system and a modem such as a baseband chipset. In addition, it will be apparent to those skilled in the art that the computing system CSYS may further include an application chipset, a camera image processor (CIP), a dynamic random access memory, etc.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
a first function block operating at a first operation voltage having a first range and generating a data signal;
a second function block operating at a second operation voltage having a second range; and
a voltage level control unit configured to selectively perform a level shifting operation on a voltage level of the data signal and to transmit a level-shifted data signal or the data signal to the second function block, wherein the voltage level control unit is configured to selectively perform the level shifting operation when a difference between the first operation voltage and the second operation voltage is detected.

2. The semiconductor device as claimed in claim 1, wherein the first range and the second range are different from each other.

3. The semiconductor device as claimed in claim 2, further comprising:
a first power line for applying the first operation voltage to the first function block; and
a second power line for applying the second operation voltage to the second function block, the second power line being separated from the first power line.

4. The semiconductor device as claimed in claim 2, wherein:
the first function block includes a control logic; and
the second function block includes a memory.

5. The semiconductor device as claimed in claim 1, wherein the first range and the second range are the same.

6. The semiconductor device as claimed in claim 5, further comprising
a first power line for applying the first operation voltage to the first function block and for applying the second operation voltage to the second function block.

7. The semiconductor device as claimed in claim 5, wherein the difference between the first operation voltage and the second operation voltage corresponds to a voltage drop or a voltage rise from the first operation voltage to the second operation voltage due to a time variance, or corresponds to a voltage drop or a voltage rise from the first operation voltage to the second operation voltage due to an operation of the first function block.

8. The semiconductor device as claimed in claim 1, wherein the voltage level control unit is configured to shift the voltage level of the data signal generated in the first function block and to transmit the level-shifted data signal to the second function block, when the first operation voltage and the second operation voltage are different from each other, and the voltage level control unit is configured to maintain the voltage level of the data signal generated in the first function block and to transmit the data signal to the second function block, when the first operation voltage and the second operation voltage are the same.

9. The semiconductor device as claimed in claim 1, wherein the voltage level control unit comprises:

a level shifter configured to be activated by a level shifting signal when the first operation voltage and the second operation voltage are different from each other, to shift the voltage level of the data signal from the first operation voltage to the second operation voltage, and to transmit the level-shifted data signal to the second function block; and a buffer unit configured to be activated by a level shifting inversion signal having a logic level that is different from that of the level shifting signal, when the first operation voltage and the second operation voltage are the same, and to transmit the data signal to the second function block.

10. The semiconductor device as claimed in claim 9, wherein the voltage level control unit further comprises a level detecting unit configured to detect the difference between the first operation voltage and the second operation voltage and to generate the level shifting signal.

11. A semiconductor device, comprising:

a first function block operating at a first operation voltage having a first range and generating a data signal;

a second function block operating at a second operation voltage having a second range; and a voltage level control unit configured to perform a level shifting operation on a voltage level of the data signal and to transmit a level-shifted data signal in response to a detected difference between the first operation voltage and the second operation voltage or in response to a low speed mode signal and to otherwise transmit the data signal to the second function block.

12. The semiconductor device as claimed in claim 11, wherein the voltage level control unit is configured to maintain the voltage level of the data signal when no difference is detected between the first operation voltage and the second operation voltage or in response to a high speed mode signal.

* * * * *